US010462909B2

(12) United States Patent
Tsukada et al.

(10) Patent No.: US 10,462,909 B2
(45) Date of Patent: Oct. 29, 2019

(54) WIRING BOARD MANUFACTURING METHOD AND WIRING BOARD MANUFACTURING DEVICE

(71) Applicant: FUJI CORPORATION, Chiryu-shi (JP)

(72) Inventors: Kenji Tsukada, Toyota (JP); Masatoshi Fujita, Anjo (JP); Yoshitaka Hashimoto, Kariya (JP); Akihiro Kawajiri, Chiryu (JP); Masato Suzuki, Chiryu (JP)

(73) Assignee: FUJI CORPORATION, Chiryu-shi (JP)

( * ) Notice: Subject to any disclaimer, the term of this patent is extended or adjusted under 35 U.S.C. 154(b) by 356 days.

(21) Appl. No.: 15/524,128

(22) PCT Filed: Nov. 14, 2014

(86) PCT No.: PCT/JP2014/080244

§ 371 (c)(1),
(2) Date: May 3, 2017

(87) PCT Pub. No.: WO2016/075823

PCT Pub. Date: May 19, 2016

(65) Prior Publication Data

US 2018/0302991 A1 Oct. 18, 2018

(51) Int. Cl.
*H05K 3/00* (2006.01)
*H05K 3/12* (2006.01)
(Continued)

(52) U.S. Cl.
CPC .......... *H05K 3/1283* (2013.01); *B29C 64/112* (2017.08); *B29C 64/124* (2017.08);
(Continued)

(58) Field of Classification Search
CPC ... B29C 64/112; B29C 64/106; B29C 64/118; B29C 64/124; B29C 64/129;
(Continued)

(56) References Cited

U.S. PATENT DOCUMENTS

2006/0068616 A1* 3/2006 Shintate ................ H05K 3/125 439/76.1
2006/0215143 A1* 9/2006 Yamaguchi ............ G03F 7/203 355/69

(Continued)

FOREIGN PATENT DOCUMENTS

JP 2004022623 A * 1/2004
JP 2006156943 A * 6/2006 ............ H05K 3/125

(Continued)

OTHER PUBLICATIONS

International Search Report dated Feb. 3, 2015 in PCT/JP2014/080244 filed Nov. 14, 2014.

*Primary Examiner* — Timothy Kennedy
(74) *Attorney, Agent, or Firm* — Oblon, McClelland, Maier & Neustadt, L.L.P.

(57) ABSTRACT

A device forms a resin layer by applying a UV light line-shaped in the X direction while conveying the work table in the Y direction at a first conveyance speed (low speed) in a case in which a wiring layer forming process is performed directly after the resin layer forming process, and forms a resin layer by applying a UV light line-shaped in the X direction while conveying the work table in the Y direction at a second conveyance speed (high speed) in a case in which a consecutive resin layer forming process is performed directly after the resin layer forming process.

4 Claims, 5 Drawing Sheets

(51) Int. Cl.

| | |
|---|---|
| ***B33Y 50/02*** | (2015.01) |
| ***B29C 64/124*** | (2017.01) |
| ***B29C 64/393*** | (2017.01) |
| ***B41M 3/00*** | (2006.01) |
| ***B41M 7/00*** | (2006.01) |
| ***B29C 64/112*** | (2017.01) |
| ***B29C 64/336*** | (2017.01) |
| *B33Y 10/00* | (2015.01) |
| *B33Y 30/00* | (2015.01) |
| *B33Y 80/00* | (2015.01) |
| *B29L 31/34* | (2006.01) |
| *H05K 1/09* | (2006.01) |

(52) U.S. Cl.

CPC .......... *B29C 64/336* (2017.08); *B29C 64/393* (2017.08); *B33Y 50/02* (2014.12); *B41M 3/006* (2013.01); *B41M 7/0081* (2013.01); *H05K 3/0014* (2013.01); *H05K 3/0055* (2013.01); *B29K 2995/0005* (2013.01); *B29L 2031/3425* (2013.01); *B33Y 10/00* (2014.12); *B33Y 30/00* (2014.12); *B33Y 80/00* (2014.12); *H01L 2924/0002* (2013.01); *H05K 1/097* (2013.01); *H05K 3/0085* (2013.01); *H05K 2203/013* (2013.01); *H05K 2203/0126* (2013.01); *H05K 2203/107* (2013.01)

(58) Field of Classification Search

CPC .. B29C 64/135; H05K 3/1216; H05K 3/1225; H05K 3/1233; H05K 3/1241; H05K 3/125; H05K 3/1275; H05K 3/1283

See application file for complete search history.

(56) References Cited

U.S. PATENT DOCUMENTS

2009/0314528 A1* 12/2009 Hirose ................. H05K 1/0265 174/256
2010/0323102 A1* 12/2010 Chopra ................ C09D 11/101 427/125
2012/0288641 A1* 11/2012 Diatezua ................. H01L 41/29 427/555
2015/0201499 A1* 7/2015 Shinar .................... H05K 3/125 425/132

FOREIGN PATENT DOCUMENTS

JP 2010034526 A * 2/2010 ........... H05K 1/0265
JP 2013-43338 A 3/2013

* cited by examiner

WIRING BOARD MANUFACTURING METHOD AND WIRING BOARD MANUFACTURING DEVICE

TECHNICAL FIELD

The present application relates to a wiring board manufacturing method and wiring board manufacturing device for manufacturing a wiring board.

BACKGROUND ART

Conventionally, there are known items that form a solid body by consecutively building layers by applying a UV-curable resin ink and then applying UV light to form a resin layer (formed material). For example, disclosed in patent literature 1 is an item for printing on the surface of a solid body that is able to harden both a formed material and a printed material by applying a UV lamp once, by performing layer building of a formed material using UV-curable resin and printing of a UV-curable ink on the surface of the layer-built formed material. Patent Literature 1: JP-A-2013-43338

SUMMARY

For the forming of the solid body, because it is necessary to apply UV light on each layer to perform hardening, the greater the quantity of layers, the longer it takes. Therefore, considering cases in which wiring boards are formed by forming wiring layers on a resin substrate by layer building a resin layer to form a resin substrate, then applying a conductive ink containing conductive particles on the resin substrate, and then applying a laser light, because a wiring layer forming step is required in addition to a resin layer forming step, there is a demand to manufacture a wiring board more efficiently.

An object of the present disclosure is to manufacture a wiring board more efficiently.

The present disclosure uses the following means to achieve the above object.

The present disclosure of a wiring board manufacturing method includes:

a resin layer forming step of forming a resin layer by applying a UV-curable resin ink and applying UV light to the applied resin ink;

a wiring layer forming step of forming a wiring layer by applying a conductive ink on the resin layer and applying a laser light or a pulse light including a continuous spectrum to the applied conductive ink;

wherein the wiring board is manufactured by layer building the resin layers and forming the wiring layer by performing the resin layer forming step and the wiring layer forming step in a predetermined order, and in a case in which the wiring layer forming step is performed directly after performing the resin layer forming step, during the prior resin layer forming step, the UV light is applied such that an integral light amount is a first integral light amount, and in a case in which another resin layer forming step is performed consecutively directly after performing the resin layer forming step, during at least a portion of the prior resin layer forming step, the UV light is applied such that the integral light amount is a second integral light amount that is smaller than the first integral light amount.

With the present disclosure of a wiring board manufacturing method, when manufacturing a wiring board by performing layer building of resin layers and forming of a wiring layer by performing the resin layer forming step and the wiring layer forming step in a predetermined order, in a case in which the wiring layer forming step is performed directly after performing the resin layer forming step, during the prior resin layer forming step, the UV light is applied such that an integral light amount is a first integral light amount, and in a case in which another resin layer forming step is performed consecutively directly after performing the resin layer forming step, during at least a portion of the prior resin layer forming step, the UV light is applied such that the integral light amount is a second integral light amount that is smaller than the first integral light amount. By this, because the resin layer directly below the wiring layer is formed by UV light with an integral light amount that is relatively large, the wiring layer can be favorably formed. Also, because overall a smaller amount of integral light is required compared to forming all the resin layers using UV light with the first integral light amount, layer building of the resin layers can be performed efficiently, and the wiring board can be manufactured efficiently. Here, "at least a portion of the prior resin layer forming step," as well as a portion of the prior resin layer forming step, includes the entire prior resin layer forming step. In the former case, for example, in a case in which the quantity of resin layer forming steps performed consecutively until performing the wiring layer forming step is equal to or greater than a specified quantity, UV light is applied such that the integral light amount is the second integral light amount, and in a case in which the quantity of resin layer forming steps performed consecutively until performing the wiring layer forming step is less than the specified quantity, UV light is applied such that the integral light amount is the first integral light amount.

With such a wiring board manufacturing method of the present disclosure, the UV light may be applied for a first application time as the first integral light amount, and the UV light may be applied for a second application time that is shorter than the first application time as the second integral light amount; or, the UV light may be applied with a first UV strength as the first integral light amount, and the UV light may be applied for a second UV strength that is weaker than the first UV strength as the second integral light amount. In the former case, compared to a case in which all the resin layers are formed using the UV light for the first application time, the overall application time can be shortened, and the manufacturing time for the wiring board can be shortened. Also, in the latter case, compared to a case in which all the resin layers are formed using the light UV with the first strength, energy used can be reduced.

A wiring board manufacturing device of the present disclosure is for manufacturing a wiring board by performing layer building of a resin layer and forming of a wiring layer, the device including:

a first applying means configured to apply a UV-curable resin ink;

a UV light emitting means configured to emit UV light;

a second applying means configured to apply a conductive ink;

a light emitting means configured to emit a laser light or a pulse light including a continuous spectrum; and a control means configured to perform, in a predetermined order, resin layer forming control for forming the resin layer by applying the resin ink using the first applying means, and applying UV light to the applied resin ink using the UV light emitting means, and wiring layer forming control for forming the wiring layer by applying the conductive ink on the resin layer using the second applying means, and applying laser light or pulse light including a continuous spectrum to the applied conductive ink using the light emitting means.

Because the wiring board manufacturing device of the present disclosure is provided with a configuration for performing the above wiring board manufacturing method of the present disclosure, it can achieve the same effects as the wiring board manufacturing method of the present disclosure.

DESCRIPTION OF EMBODIMENTS

Next, a form for performing the present disclosure will be described using an example embodiment.

Figure 1:
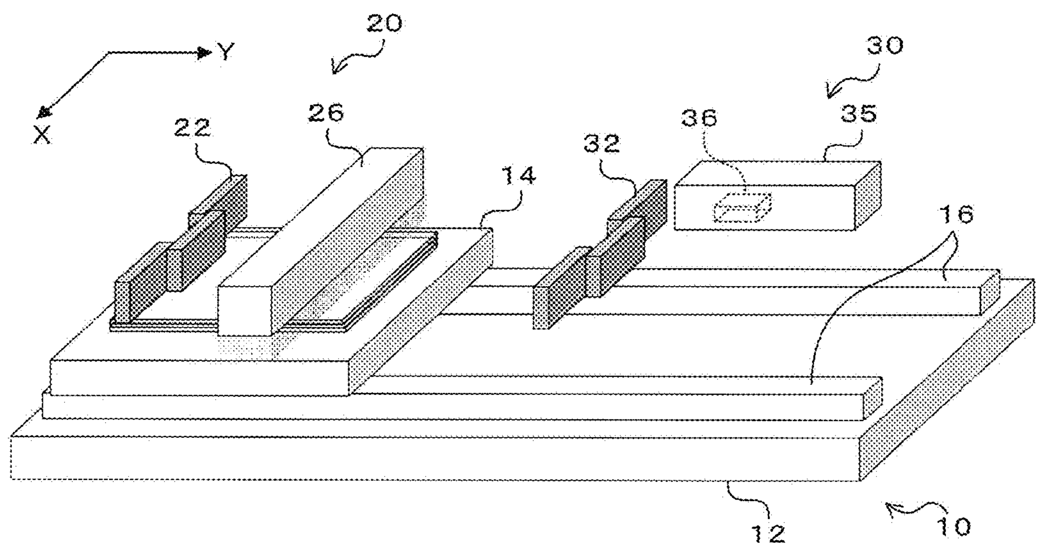
FIG. 1 is a configuration diagram showing an outline of the configuration of wiring board manufacturing device 10, which is an embodiment.
Figure 2:
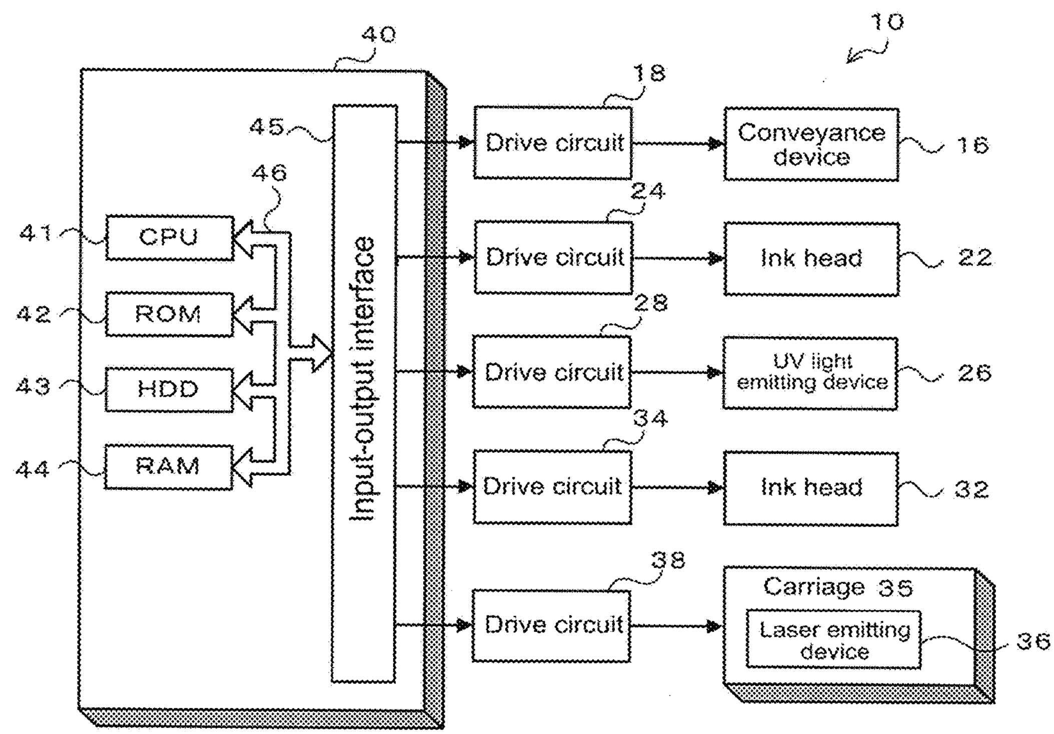
FIG. 2 is a block diagram showing the electrical connections of control device 40 of wiring board manufacturing device 10.

FIG. 1 is a configuration diagram showing an outline of the configuration of wiring board manufacturing device 10, which is an embodiment; FIG. 2 is a block diagram showing the electrical connections of control device 40 of wiring board manufacturing device 10. Note that, in FIG. 1, the front-(near side) rear (far side) direction is the X direction and the left-right direction is the Y direction.

As shown in FIG. 1, the embodiment wiring board manufacturing device 10 is provided with base 12, conveyance device 16 that conveys work table 14 provided on base 12 in the Y direction, resin layer forming unit 20 that manufactures a resin substrate by layer building resin layers on work table 14, wiring layer forming unit 30 that forms a wiring pattern on the resin layers, and control device 40 (refer to FIG. 2) that controls the device overall.

Conveyance device 16, for example, is provided with a conveyor device and moves work table 14 back and forth in the Y direction by driving the conveyor device.

As shown in FIG. 1, resin layer forming unit 20 is provided with ink head 22 capable of dispensing UV-curable resin ink, and UV light emitting device 26 capable of applying UV light to the resin ink dispensed from ink head 22.

In the present embodiment, ink head 22 is configured as a line head with multiple nozzles arranged in the X direction. Ink head 22 applies (prints) a rectangular resin layer by dispensing resin ink from all the nozzles while work table 14 is conveyed (moved back and forth) in the Y direction by conveyance device 16. Note that, ink head 22 may be configured to dispense resin ink with a density higher than the nozzle pitch by using a drive device to shift in the X direction by half a pitch or ¼ of a pitch, or may be configured as a serial head loaded on a carriage that is traversable in the X direction and may dispense resin ink while the carriage traverses.

UV light emitting device 26 is configured to be capable of emitting UV light in a line shape in the X direction. UV light emitting device 26 consecutively hardens the applied resin layer by applying line-shaped (in the X direction) UV light to the rectangular resin layer applied on work table 14 while work table 14 is conveyed (moved back and forth) in the Y direction, UV light emitting device 26, for example, may use a mercury lamp, a metal-halide lamp, or the like.

Resin layer forming unit 20 layer builds resin layers so as to form a resin substrate of a specified thickness by repeating application of a resin layer by ink head 22 and hardening of the resin layer using UV light emitting device 26 multiple times.

Wiring forming unit 30 is provided with ink head 32 capable of dispensing a conductive-particle-containing ink in which conductive particles such as metal nano particles are dispersed in a dispersant, and laser emitting device 36 that applies a laser beam to the conductive-particle-containing ink dispensed from ink head 32.

In the present embodiment, ink head 32 is configured as a line head with multiple nozzles arranged in the X direction. Ink head 32 applies (prints) the conductive-particle-containing ink to any position on the resin layer by dispensing the conductive-particle-containing ink from a corresponding nozzle while work table 14 is conveyed in the Y direction by conveyance device 16. Specifically, ink head 32 forms a wiring layer on the resin layer (resin substrate) by dispensing the conductive-particle-containing ink from a corresponding nozzle along a planned wiring line that is decided in advance. Note that, ink head 32 may be configured to dispense conductive-particle-containing ink with a density higher than the nozzle pitch by using a drive device to shift in the X direction by half a pitch, or may be configured as a serial head loaded on a carriage that is traversable in the X direction and may dispense conductive-particle-containing ink while the carriage traverses.

As shown in FIG. 2, laser emitting device 36 is loaded on carriage 35 that can be moved in the X direction by the driving of a carriage motor (not shown), and causes a laser beam to traverse along a planned wiring line (wiring layer) on a resin substrate formed on work table 14 by movement of laser emitting device 36 in the X direction and movement of work table 14 in the Y direction. The wiring layer is made into a conductor by the dispersant around the conductive particles being broken down by the laser beam.

Wiring layer forming unit 30 builds wiring layers while turning the wiring into a conductor to form a wiring pattern on the resin substrate by repeating multiple times application of the conductive-particle-containing ink using ink head 32, and making the conductive-particle-containing ink a conductor using laser emitting device 36.

Figure 4:
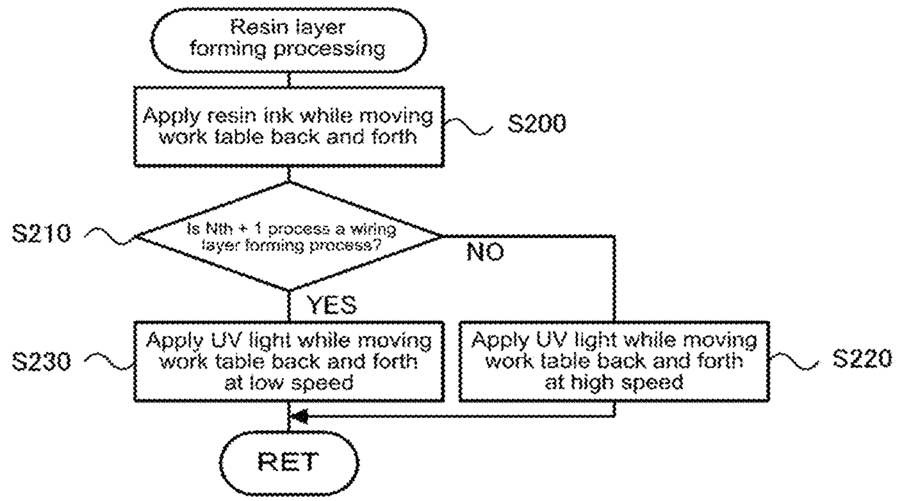
FIG. 4 is a flowchart showing an example of resin layer forming processing performed by CPU 41 of control device 40.

As shown in FIG. 4, control device 40 is configured from a microprocessor that is based around CPU 41, and is also provided with ROM 42, HDD 43, RAM 44, and input/output interface 45. These items are electrically connected by bus 46. Although not shown, a detection signal from a position detecting sensor that detects the position of work table 14 in the Y direction, a detection signal of a position detecting sensor that detects the position of carriage 35 in the X direction, and the like are inputted to control device 40 via an input/output interface. Also, a control signal to drive circuit 18 that drives conveyance device 16 (conveyor device), a control signal to drive circuit 24 that drives ink head 22, a control signal to drive circuit 28 that drives UV light emitting device 26, a control signal to drive circuit 34 that drives ink head 32, a control signal to drive circuit 38 that drives carriage 35 (carriage motor) and laser emitting device 36, and the like are outputted from control device 40 via an input/output interface.

Figure 3:
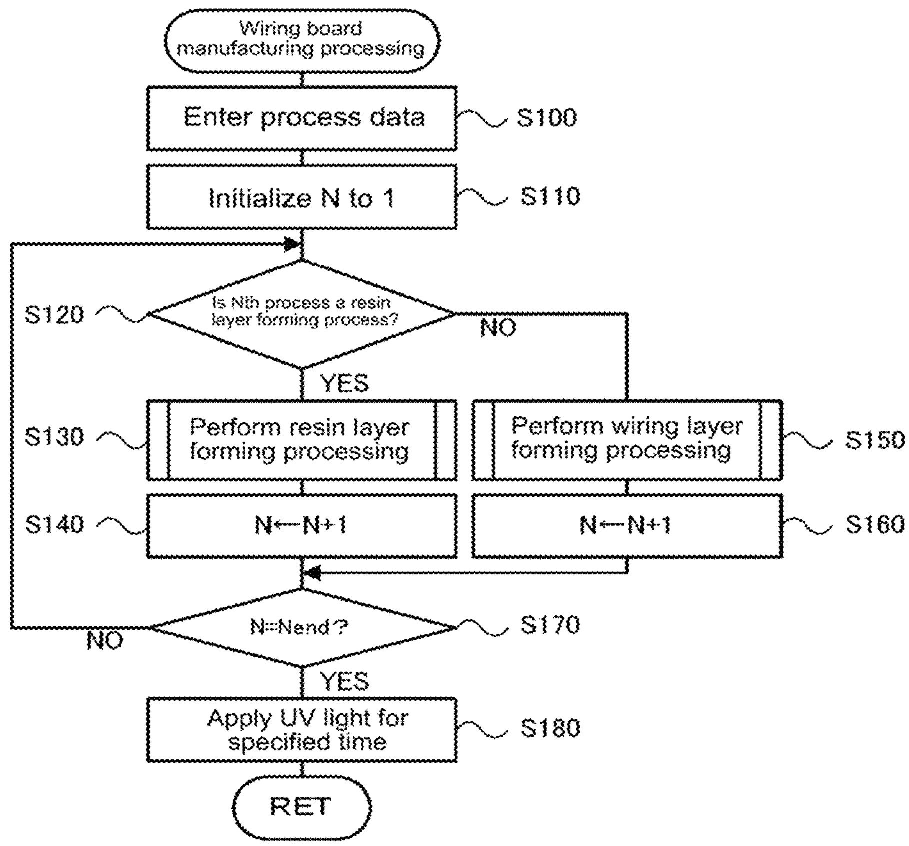
FIG. 3 is a flowchart showing an example of wiring board manufacturing processing performed by CPU 41 of control device 40.

Operation of the embodiment wiring board manufacturing device 10 configured as above is described next. FIG. 3 is a flowchart showing an example of wiring board manufacturing processing performed by CPU 41 of control device 40.

When wiring board manufacturing processing is performed, CPU 41 of control device 40 first has entered predetermined process data with the performing order of forming the resin layers and forming the wiring layers, and initializes the performance quantity to a value of one. Note that, process data may be entered via input from an input device, which is not shown, based on operations of an operator. Next, CPU 41, based on the entered process data, determines which number (performance quantity N) process the resin layer forming process is (S120); having determined which number process the resin layer forming process is, CPU 41 performs resin layer forming processing (S130), increments the performance quantity N by one (S140), and having determined that the number process is the wiring layer forming process, performs wiring layer forming processing (S150), and increments the performance quantity N by one (S160). Here, resin layer forming processing is performed according to the flowchart of FIG. 4, and wiring layer forming processing is performed according to the flowchart of FIG. 5. Also, CPU 41 determines whether the performance quantity N has reached a specified quantity Nend that indicates the end of the processes (S170). If CPU 41 determines that the performance quantity has not reached specified quantity Nend, CPU 41 returns to S120 and performs the Nth process; having determined that the performance quantity N has reached the specified quantity Nend, CPU 41 controls conveyance device 16 and laser emitting device 36 to apply UV light over a specified time for finishing the manufactured wiring board (S180), and then ends wiring board manufacturing processing.

In the resin layer forming processing of FIG. 4, CPU 41 first controls conveyance device 16 and ink head 22 such that resin ink is dispensed from all the nozzles while work table 14 moves back and forth in the Y direction (S200). By this, a rectangular resin layer is formed on work table 14. Then, CPU 41 determines whether the Nth+1 process is a wiring layer forming process based on the process data inputted in S100. Processing of S210 is currently being considered in the case that the Nth process is a resin layer forming process, therefore processing determines whether a wiring layer forming process is to be performed directly after performing this resin layer forming process. If it is determined that the Nth+1 process (the next process) is not a wiring layer forming process, that is, that the Nth+1 process (the next process) is a consecutive resin layer forming process, conveyance device 16 and UV light emitting device 26 are controlled such that line-shaped (in the X direction) UV light is applied while work table 14 is moving back and forth at high speed (second conveyance speed) (S220), then resin layer forming processing is ended. On the other hand, if it is determined that Nth+1 process (the next process) is a wiring layer forming process, conveyance device 16 and UV light emitting device 26 are controlled such that line-shaped (in the X direction) UV light is applied while work table 14 is moving back and forth at low speed (first conveyance speed) (S230), then resin layer forming processing is ended. Here, the first conveyance speed (low speed) is a conveyance speed that achieves the application time required to completely harden the applied resin ink using the UV light. On the other hand, the second conveyance speed (high speed), is a speed faster than the first conveyance speed that makes the application shorter; therefore does not completely harden the applied resin ink (partially hardens). The reason for this is given later.

Figure 5:
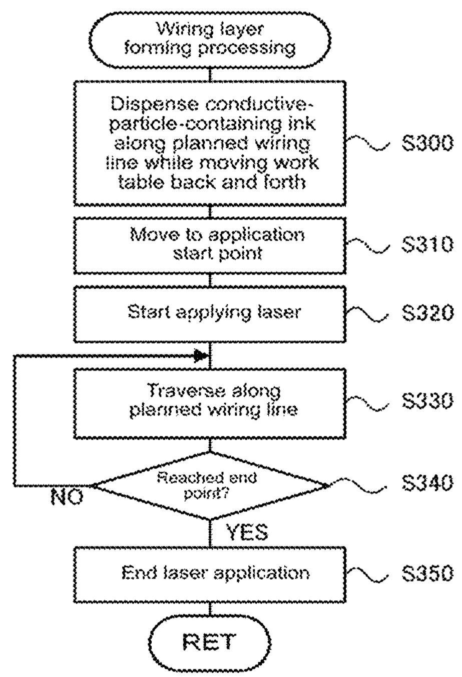
FIG. 5 is a flowchart showing an example of wiring layer forming processing performed by CPU 41 of control device 40.

With wiring layer forming processing of FIG. 5, CPU 41 first controls conveyance device 16 and ink head 32 such that conductive-particle-containing ink is dispensed along a planned wiring line while work table 14 is moved in the Y direction (S300). Next, CPU 41 controls carriage 35 and conveyance device 16 such that laser emitting device 36 moves relative to an application start point with respect to the resin layer (resin substrate) on which the conductive-particle-containing ink was applied (S310). Then, CPU 41 controls laser emitting device 36 to start applying a laser beam (S320), and controls carriage 35 and conveyance device 16 such that the laser beam traverses along the planned wiring line (S330). By this, the conductive-particle-containing ink applied along the planned wiring line is made into a conductor by the dispersant around the conductive particles being broken down by the laser beam. Next, CPU 41 determines whether the laser beam has reached an end point of the planned wiring line (S340), and if determining that the laser beam has not reached the end point of the planned wiring line, returns to S330 and continues causing the laser beam to traverse, and if determining that the laser beam has reached the end point of the planned wiring line, controls laser emitting device 36 to end application of the laser beam (S350), and ends wiring layer forming processing.

Figure 6:
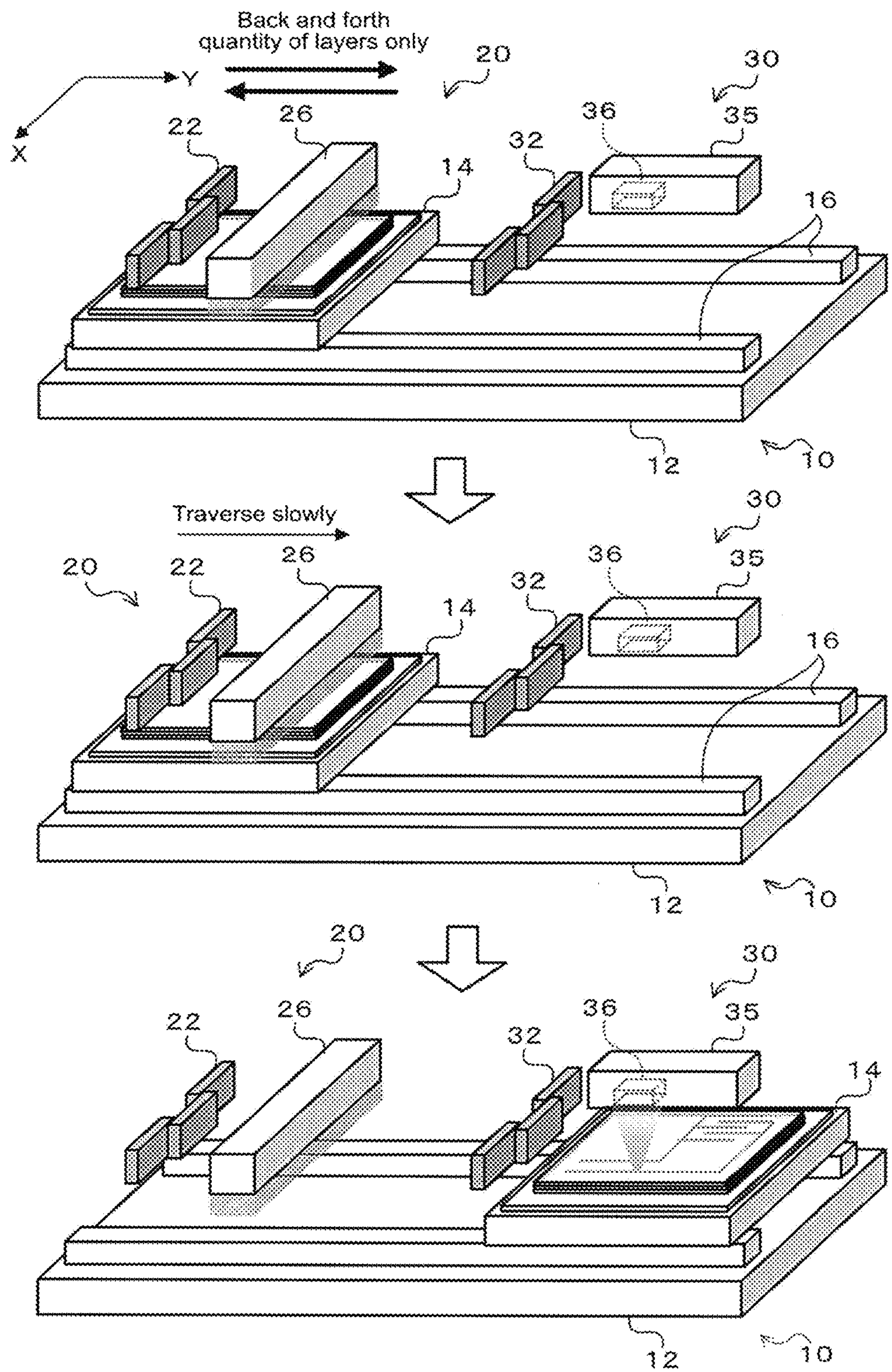
FIG. 6 illustrates states during manufacturing of a wiring board using the embodiment wiring board manufacturing device 10.

FIG. 6 illustrates states during manufacturing of a wiring board using the embodiment wiring board manufacturing device 10. As shown, manufacturing of a resin board is performed by repeating for the number of layers back and forth movement of work table 14 in accordance with dispensing of resin ink in the resin layer forming process, and back and forth movement of work table 14 in accordance with application of UV light. In a case in which the process after the current resin layer forming process is a consecutive resin layer forming process, the conveyance speed of work table 14 moving back and forth is the second conveyance speed (high speed), and the application time of the UV light is shorter than the application time required to completely harden the applied resin ink. However, because the UV light penetrates the upper resin layer, as the layering of the resin layer is repeated, the lower the resin layer, the more the light amount of the UV light accumulates, thus hardening proceeds. On the other hand, in a case in which the process after the resin layer forming process is a wiring layer forming process, the next wiring layer forming process (refer to FIG. 6[*c*]) is performed after performing moving back and forth of work table 14 at low speed (refer to FIG. 6[*b*]) in accordance with the application of UV light in the prior resin layer forming process. That is, in a case in which the process directly after the resin layer forming process is a wiring layer forming process, in the next wiring layer forming process, the wiring layer is formed on the hardened resin layer after the resin layer has been completely hardened by sufficient UV light being applied in the prior resin layer forming process. This is because, in a case in which the wiring layer is formed on a resin layer that has not been sufficiently hardened, organic gas is generated from the unhardened components of the lower resin layer by the heat from the application of the laser beam, the generated organic gas obstructs the breaking down of the dispersant, meaning that there is a worry that conductivity will not be sufficiently maintained. In this manner, because wiring board manufacturing device 10 of the present embodiment makes the IN light application time short in a case in which the process directly after the resin layer forming process is a consecutive resin layer forming process, and makes the UV light application long in a case in which the process directly after the resin layer forming process is a wiring layer forming process, wiring board manufacturing device 10 maintains high conductivity in the wiring pattern formed on the resin substrate while performing manufacturing of the resin substrate in a short time.

Wiring board manufacturing device 10 of the embodiment as described above, by forming a resin substrate by repeating a resin layer forming process that forms a resin layer on work table 14 using resin layer forming unit 20 in order to layer build resin layers, and performing a wiring layer forming process that forms a wiring layer on the resin layer using wiring layer forming unit 30, as a device that manufactures a wiring board by forming a wiring pattern on a resin substrate, forms a resin layer by applying a UV light line-shaped in the X direction while conveying work table 14 in the Y direction at a first conveyance speed (low speed) in a case in which a wiring layer forming process is performed directly after the resin layer forming process, and forms a resin layer by applying a UV light line-shaped in the X direction while conveying work table 14 in the Y direction at a second conveyance speed (high speed) in a case in which a consecutive resin layer forming process is performed directly after the resin layer forming process. By this, because wiring board manufacturing device 10 of the present embodiment can perform layer building of resin layers in a short time, wiring board manufacturing device 10 can perform manufacturing of wiring boards efficiently. Also, when forming a wiring layer on a resin substrate, because the resin layer directly below is completely hardened by the application of sufficient UV light, the dispersant can be efficiently broken down and a wiring pattern with high conductivity can be formed.

With wiring board manufacturing device 10 of the embodiment, the conveyance speed of work table 14 (that is, the application time of the UV light) is different in a case in which a wiring layer forming process is performed directly after the resin layer forming process and a case in which a consecutive resin layer forming process is performed directly after the resin layer forming process; however, for completely hardening the resin layer of the prior resin layer forming process in a case in which a wiring layer forming process is performed directly after the resin layer forming process, and for partially hardening the resin layer of the prior resin layer forming process in a case in which a consecutive resin layer forming process is performed directly after the resin layer forming process, the application time of the UV light may be the same and the UV strength may be different, or both the application time of the UV light and the UV strength may be different.

Figure 7:
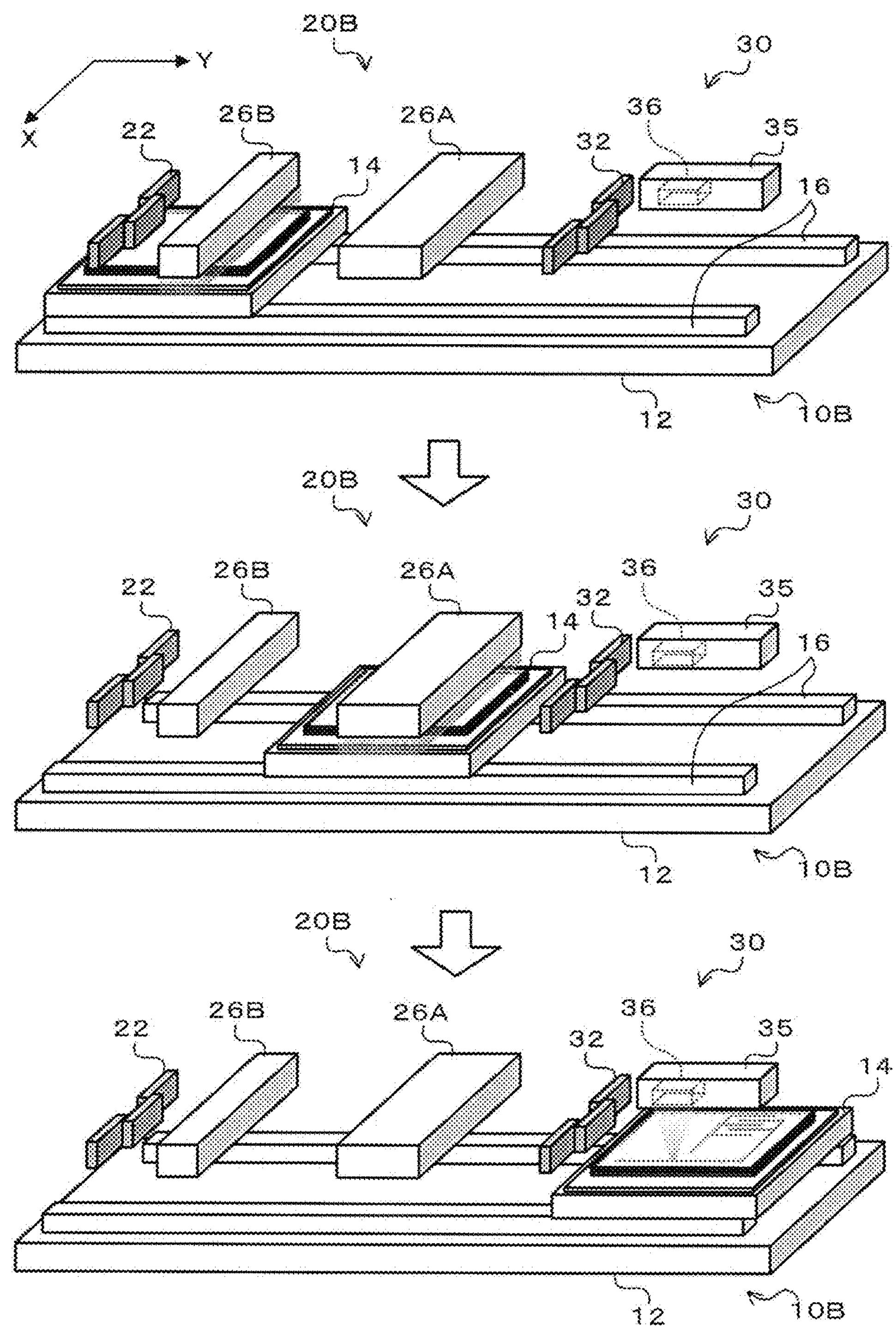
FIG. 7 illustrates states during manufacturing of a wiring board using the embodiment wiring board manufacturing device 10B.

Wiring board manufacturing device 10 of the embodiment applies UV light to the resin layer using one UV light emitting device 26, but the configuration is not limited to this, and resin layers may be formed using multiple UV light emitting devices with different UV strengths. For example, similar to UV light emitting device 26 of the embodiment, a first UV light emitting device with a relatively strong UV strength and a second UV light emitting device with a relatively weak UV strength may be provided, and UV light may be applied to the resin layer using the first UV light emitting device when performing a wiring layer forming process directly after the resin later forming process, and UV light may be applied to the resin layer using the second UV light emitting device when performing a consecutive resin layer forming process directly after the resin later forming process. FIG. 7 illustrates states during manufacturing of a wiring board using the embodiment wiring board manufacturing device 10B. As shown in the figure, manufacturing a resin substrate is performed by second UV light emitting device 26B with a weak UV strength applying UV light to resin ink applied on work table 14 while conveying work table 14 in the Y direction in a case in which the next process after the current resin layer forming process is a consecutive resin layer forming process, and manufacturing a resin substrate is performed by first UV light emitting device 26A with a strong UV strength applying UV light to resin ink applied on work table 14 while conveying work table 14 in the Y direction in a case in which the next process after the current resin layer forming process is a wiring layer forming process. In this case, if second UV light emitting device 26B is off while first UV light emitting device 26A is on, and first UV light emitting device 26A is off while second UV light emitting device 26B is on, energy usage of the overall device can be reduced. Note that, with a UV emitting device of a type that requires startup time before outputting, the on timing may be decided taking into account the startup time.

With wiring board manufacturing device 10 of the embodiment, the wiring is made a conductor by applying laser light to the wiring layer, but the configuration is not limited to this, and the wiring layer may be made a conductor by applying pulse light (for example, a xenon lamp) with a continuous spectrum region (for example, a continuous spectrum from ultra-violet to infra-red) to the wiring layer.

With wiring board manufacturing device 10 of the embodiment, in a case in which the next process is a consecutive resin layer forming process, always, in the prior resin layer forming process, UV light application is performed at high speed (application time is short), however configurations are not limited to this, and even if the next process is a consecutive resin layer forming process, in the prior resin layer forming process, there may be a case in which UV light is applied at high speed (making the application time short) and a case in which UV light is applied at low speed (making the application time long). That is, the resin layer forming process may be performed with UV light applied at high speed (making the application time short) to at least a portion of the prior resin layer forming process in a case in which the next process is a consecutive resin layer forming process. Also, even if the next process is a consecutive resin layer forming process, in the prior resin layer forming process, there may be a case in which UV light with a weak strength is applied and a case in which UV light with a strong strength is applied. That is, the resin layer forming process may be performed with UV light with a weak strength applied to at least a portion of the prior resin layer forming process in a case in which the next process is a consecutive resin layer forming process. Note that, even if the next process is a consecutive resin layer forming process, in the prior resin layer forming process, as a case in which application of UV light is performed at low speed and with UV light of a strong strength, it is possible to consider a case in which the process quantity until performing the wiring layer forming process is within a specified quantity (for example, 2 or 3), or the like.

With wiring board manufacturing device 10 of the embodiment, application of the resin layer by ink head 22 and application of UV light by UV light emitting device 26 is performed by moving work table 14 back and forth a single time, but configurations are not limited to this, and UV light may be applied by UV light emitting device 26 to multiple resin layers all at once after performing application of a resin layer multiple times by ink head 22 during back and forth movement of work table 14.

Correspondences between main constituent elements of the embodiments and main constituent elements of the disclosure will be clarified here. Ink head 22 corresponds to a "first applying means," UV light emitting device 26 corresponds to a "UV light emitting means," ink head 32 corresponds to a "second applying means," laser emitting device 36 corresponds to a "light emitting means," and CPU 41 of control device 40 that performs the wiring board manufacturing processing of FIG. 3 (the resin layer forming process of FIG. 4 and the wiring layer forming process of FIG. 5) corresponds to a "control means."

Meanwhile, it goes without saying that the disclosure is not limited to the above-mentioned embodiments and various embodiments may be applied within the technical scope of the disclosure.

INDUSTRIAL APPLICABILITY

The present disclosure may be applied to the industrial field of wiring board manufacturing devices and the like.

REFERENCE SIGNS LIST

10, 10B: wiring board manufacturing device; 12: base; 14: work table; 16: conveyance device; 18: drive circuit; 20, 20B: resin layer forming unit; 22: ink head; 24: drive circuit; 26: UV light emitting device; 26A: first UV light emitting device; 26B: second UV light emitting device; 28: drive circuit; 30: wiring layer forming unit; 32: ink head; 34: drive circuit; 35: carriage; 36: laser emitting device; 38: drive device; 40: control device; 41: CPU; 42: ROM; 43: HDD; 44: RAM; 45: input/output interface; 46: bus

The invention claimed is:

1. A wiring board manufacturing method comprising:

a resin layer forming step of forming a resin layer by applying a UV-curable resin ink and applying UV light to the applied resin ink;

a wiring layer forming step of forming a wiring layer by applying a conductive ink on the resin layer and applying a laser light or a pulse light including a continuous spectrum to the applied conductive ink;

wherein the wiring board is manufactured by layer building the resin layer and forming the wiring layer by performing the resin layer forming step and the wiring layer forming step in a predetermined order, and in a case in which the wiring layer forming step is performed directly after performing the resin layer forming step, during the prior resin layer forming step, the UV light is applied such that an integral light amount is a first integral light amount, and in a case in which another resin layer forming step is performed consecutively directly after performing the resin layer forming step, during at least a portion of the prior resin layer forming step, the UV light is applied such that the integral light amount is a second integral light amount that is smaller than the first integral light amount.

2. The wiring board manufacturing method according to claim 1, wherein the UV light is applied for a first application time as the first integral light amount, and the UV light is applied for a second application time that is shorter than the first application time as the second integral light amount.

3. The wiring board manufacturing method according to claim 1, wherein the UV light is applied with a first UV strength as the first integral light amount, and the UV light is applied for a second UV strength that is weaker than the first UV strength as the second integral light amount.

4. A wiring board manufacturing device for manufacturing a wiring board by performing layer building of a resin layer and forming of a wiring layer, the device comprising:

a first applying means configured to apply a UV-curable resin ink;

a UV light emitting means configured to emit UV light;

a second applying means configured to apply a conductive ink;

a light emitting means configured to emit a laser light or a pulse light including a continuous spectrum; and a control means configured to perform, in a predetermined order, resin layer forming control for forming the resin layer by applying the resin ink using the first applying means, and applying UV light to the applied resin ink using the UV light emitting means, and wiring layer forming control for forming the wiring layer by applying the conductive ink on the resin layer using the second applying means, and applying laser light or pulse light including a continuous spectrum to the applied conductive ink using the light emitting means.

* * * * *